United States Patent
Kawaguchi et al.

(10) Patent No.: US 8,728,843 B2
(45) Date of Patent: May 20, 2014

(54) NITRIDE SEMICONDUCTOR LIGHT EMITTING ELEMENT AND METHOD FOR MANUFACTURING SAME

(75) Inventors: Hirofumi Kawaguchi, Tokushima (JP); Akinori Yoneda, Anan (JP); Hiroshi Doi, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/580,941

(22) PCT Filed: Feb. 4, 2011

(86) PCT No.: PCT/JP2011/052358
§ 371 (c)(1),
(2), (4) Date: Aug. 23, 2012

(87) PCT Pub. No.: WO2011/105194
PCT Pub. Date: Sep. 1, 2011

(65) Prior Publication Data
US 2013/0009195 A1    Jan. 10, 2013

(30) Foreign Application Priority Data
Feb. 26, 2010    (JP) .................................. 2010-041314

(51) Int. Cl.
*H01L 21/00*    (2006.01)

(52) U.S. Cl.
USPC .................................... 438/46; 257/E33.033

(58) Field of Classification Search
USPC ..................................... 257/E33.033; 438/46
See application file for complete search history.

(56) References Cited

U.S. PATENT DOCUMENTS

| | | |
|---|---|---|
| 2004/0256631 A1 | 12/2004 | Shin |
| 2006/0249736 A1 | 11/2006 | Lee et al. |
| 2007/0023777 A1 | 2/2007 | Sonobe et al. |
| 2007/0029568 A1 | 2/2007 | Choo et al. |
| 2007/0166861 A1* | 7/2007 | Jeon et al. .................. 438/39 |
| 2008/0210957 A1* | 9/2008 | Watanabe et al. ............. 257/89 |
| 2010/0237384 A1 | 9/2010 | Choo et al. |

FOREIGN PATENT DOCUMENTS

| | | |
|---|---|---|
| JP | 2002-190618 A | 7/2002 |
| JP | 2002-280618 A | 9/2002 |
| JP | 2005-19939 A | 1/2005 |
| JP | 2006-506827 A | 2/2006 |
| JP | 2006-313888 A | 11/2006 |
| JP | 2007-184411 A | 7/2007 |
| JP | 2007-184597 A | 7/2007 |
| WO | WO-2006-043422 A1 | 4/2006 |

* cited by examiner

*Primary Examiner* — Julio J Maldonado
*Assistant Examiner* — Hajar Kolahdouzan
(74) *Attorney, Agent, or Firm* — Global IP Counselors, LLP

(57) ABSTRACT

A nitride semiconductor light emitting element has; a laminate of a first conduction type semiconductor layer, a light emitting layer and a second conduction type semiconductor layer of a different conduction type from that of the first conduction type semiconductor layer; and electrodes with a laminate structure formed on the first conduction type semiconductor layer, the electrodes include a conductive region of a first layer which has the conductive region and an insulated region.

12 Claims, 7 Drawing Sheets

NITRIDE SEMICONDUCTOR LIGHT EMITTING ELEMENT AND METHOD FOR MANUFACTURING SAME

CROSS-REFERENCE TO RELATED APPLICATIONS

This national phase application claims priority to Japanese Patent Application No. 2010-041314 filed on Feb. 26, 2010. The entire disclosure of Japanese Patent Application No. 2010-041314 is hereby incorporated herein by reference.

TECHNICAL FIELD

The present invention relates to a nitride semiconductor light emitting element composed of a nitride semiconductor, and to a method for manufacturing the same.

BACKGROUND ART

In the past, a high-reflectivity electrode made of silver or a silver alloy, aluminum or an aluminum alloy, or the like was used as the electrode material for obtaining ohmic contact between a p-side semiconductor and an n-side semiconductor in nitride semiconductor light emitting elements of the flip-chip type. Using these highly reflective materials and efficiently reflecting light produced in the light emitting layer of the light emitting element made it possible to produce very bright light emitting elements.

However, regardless of the electrode material, both a p-ohmic electrode and an n-ohmic electrode must be disposed to the inside of the p-n junction interface to prevent electrical leakage at the p-n junction interface in the formation of the electrodes, resulting in a region where the reflective material is not formed on the semiconductor layer surface.

This region in which no electrodes are formed can sometimes lead to light leakage from that area to the element junction board side, which decreases the emission output at the light emitting device surface.

Also, when a highly reflective material is used for the electrodes, a metal film is formed for the purpose of covering the highly reflective material to prevent migration (see WO 2006-43422, for example).

This metal film was formed in a larger surface area than that of the highly reflective material, but because it was a conductive film, it had to be formed to the inside of the p-n junction interface (on the highly reflective material side). Therefore, it was difficult to ensure that a region that allowed efficient reflection would extend all the way to the p-n junction interface.

Meanwhile, there is a method in which an oxide is formed in the region in which no electrodes are formed. This method involves, for example, forming a metal film composed of a plurality of layers, then forming a mask by photolithography, and etching so that just a first ohmic metal layer is not etching. After this, a heat treatment or the like is performed to oxidize just the unmasked region, and the mask is removed to produce an oxide region and a metal region (see JP 2002-190618A, for example).

DISCLOSURE OF THE INVENTION

It is an object of the present invention to provide a nitride semiconductor light emitting element with which light emitted from a light emitting layer is prevented from leaking out from a region in which no electrodes are formed, which keeps light emission loss to a minimum and affords lower power consumption and higher emission efficiency.

It is a further object to provide a method for simply and reliably manufacturing this nitride semiconductor light emitting element, without the use of a complicated process.

The inventors conducted diligent research aimed at efficiently extracting light emitted from the light emitting layer of a nitride semiconductor light emitting element (hereinafter sometimes referred to simply as a "light emitting element"), and as a result perfected the invention upon newly discovering that not only improving the electrode structure and disposing a layer that promotes reflection in the region where no electrodes are formed, but also keeping crystal damage at a minimum on the surface in this region is effective at preventing light leakage from this region.

That is, a nitride semiconductor light emitting element of the present invention has: a laminate of a first conduction type semiconductor layer, a light emitting layer and a second conduction type semiconductor layer of a different conduction type from that of the first conduction type semiconductor layer; and electrodes with a laminate structure formed on the first conduction type semiconductor layer, the electrodes include a conductive region of a first layer which has the conductive region and an insulated region.

In the nitride semiconductor light emitting element, it is preferable that the electrode with the laminated structure further comprises a second layer being such that at least its entire surface is in contact with the nitride semiconductor layer, and a third layer, the first layer covers the second layer, and has the conductive region disposed around the outer periphery of the second layer and the insulated region disposed around the outer periphery of the conductive region, respectively, and the third layer is formed on the first layer.

Also, it is preferable that the electrode with the laminated structure further comprises a fourth layer between the first layer and the third layer, an outer edge of the fourth layer coincides with an outer edge of the conductive region of the first layer.

Further, it is preferable that the second layer is an electrode that contains silver, and an entire upper face and side faces of the second layer are covered by the first layer.

Moreover, it is preferable that the insulated region is formed of an oxide.

It is preferable that the first layer contains titanium, niobium, tantalum, hafnium, aluminum, chrome, vanadium, tungsten, molybdenum, zirconium or zinc as a constituent element.

It is preferable that the first layer is such that an outer edge of the insulated region coincides with an outer edge of the first conduction type semiconductor layer.

It is preferable that the first conduction type semiconductor layer is a p type semiconductor layer, and the second conduction type semiconductor layer is an n type semiconductor layer.

A method for manufacturing a nitride semiconductor light emitting element of the present invention has the steps of: (a) forming a laminate in which a first conduction type semiconductor layer, a light emitting layer and a second conduction type semiconductor layer of a different conduction type from that of the first conduction type semiconductor layer are laminated; (b) forming a first metal layer that is in contact with at least part of an upper face of the first conduction type semiconductor layer; (c) laminating a second metal layer on the first metal layer; and (d) patterning the second metal layer so that part of the first metal layer is exposed, and oxidizing the exposed first metal layer, thereby forming an insulated region in the first metal layer disposed on an outer periphery of the second metal layer.

It is preferable that, in the step (b), forming the first metal layer such that an upper surface of the semiconductor layer disposed above the light emitting layer is covered.

It is preferable that further has the step of forming a third layer on the semiconductor layer disposed above the light emitting layer, before the step (b) and then, in the step (b), forming the first metal layer on the first conduction type semiconductor layer.

It is preferable that, in the step (b), forming the first metal layer such that an entire surface of the first conduction type semiconductor layer is covered.

It is preferable that, in the step (a), forming the lamination such that an n type semiconductor layer in which part hereof is exposed, the light emitting layer and the p type semiconductor layer are laminated, in the step (b), forming the first metal layer from on the exposed n type semiconductor layer to the surface of the p type semiconductor layer, and in the step (d), forming the insulated region in the first metal layer from on the exposed part of the n type semiconductor layer to the surface of the p type semiconductor layer, at patterning the second metal layer so that part of the first metal layer is exposed.

With the present invention, light emitted from the light emitting layer can be effectively prevented from leaking out from the region in which no electrodes are formed. This keeps light emission loss to a minimum, and provides a light emitting element with lower power consumption and higher emission efficiency.

Also, this light emitting element can be manufactured simply and reliably, without the use of a complicated process.

DETAILED DESCRIPTION OF THE PREFERRED EMBODIMENTS

The nitride semiconductor light emitting element of the present invention has a laminate of a first conduction type semiconductor layer, a light emitting layer, a second conduction type semiconductor layer with a different conduction type from that of the first conduction type semiconductor layer, and electrodes with a laminated structure formed on the first conduction type semiconductor layer. The electrodes with the laminated structure have a conductive region of a first layer having the conductive region and an insulated region, and one or more conductive layers. In other words, the conductive region of the first layer constitutes part of the electrode. The first layer includes an insulated region that extends from the electrode (here, the portion constituting the electrode of the first layer is the conductive region). The insulated region and the conductive region of the first layer are disposed in a region that contacts with the first conduction type semiconductor layer. The term "first conduction type" here refers to either a p type or an n type, and the "second conduction type" refers to a conduction type that is different from the first conduction type, that is, either a p type or an n type.

The result of this configuration is that an insulating layer is disposed in a region other than the region with the electrodes formed on the semiconductor layer, and this insulating layer allows light emitted from the light emitting layer to be reflected more efficiently. Thus, the leakage of light that occurred in the past from the region in which no electrodes were formed can be effectively prevented, and more efficient light emission can be achieved.

Also, since there is no risk of this insulating layer short-circuiting, it can be disposed all the way to the interface of the pn junction in plan view, which allows emission efficiency to be further increased.

Furthermore, since this insulating layer covers the surface of the first conduction type semiconductor layer, damage to the crystals on that surface during the manufacturing process can be avoided, so a light emitting element can be obtained with higher reliability and better characteristics.

Electrode with Laminated Structure/First Layer

The first layer comprises a conductive region and an insulated region in the region contacting with the first conduction type semiconductor layer. Also, one of the layers of the electrodes with the laminated structure includes the conductive region of the first layer.

Figure 3:
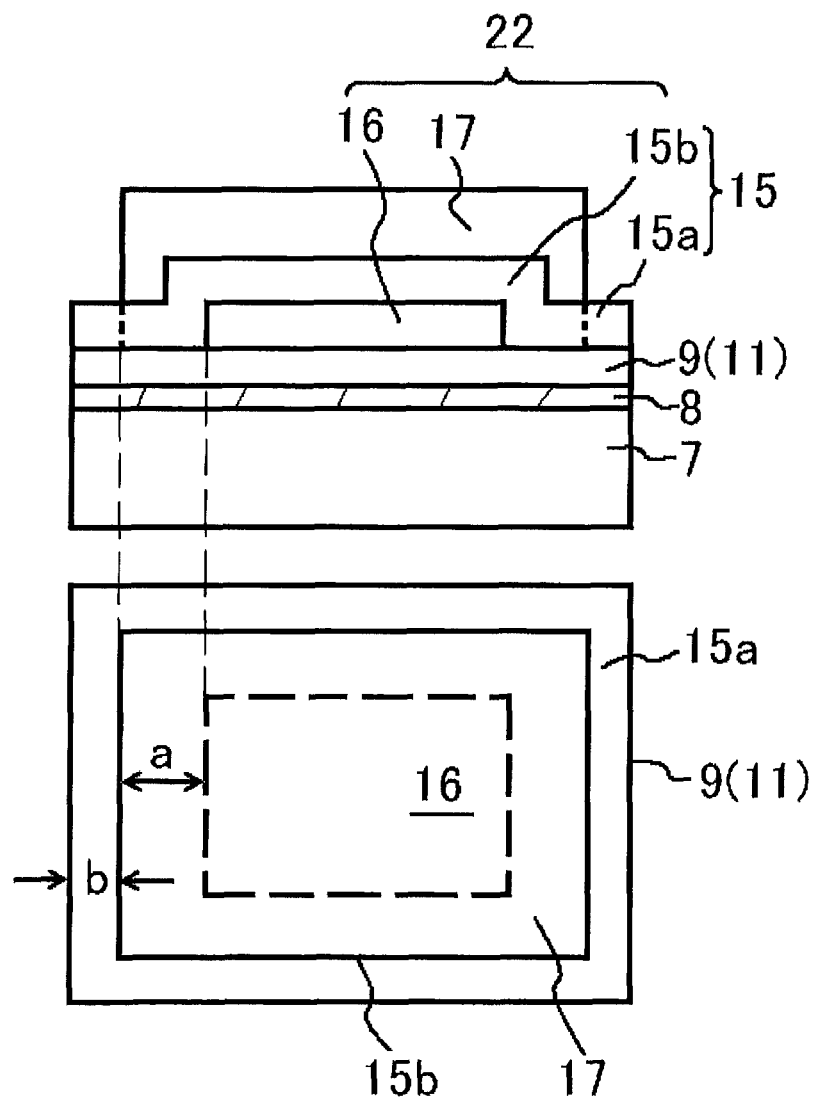
FIG. 3 is a simplified cross section and a plan view illustrating the electrode structure in the light emitting element in FIG. 1.

Examples of the layout of the conductive region and insulated region include in bands, in islands, and so on. Of these, the insulated region is preferably disposed around the outer periphery of the conductive region. The "outer periphery" here means the region around the periphery on the outside. Referring to FIG. 3, the outer periphery refers, for example, to an insulated region 15a, which is the region around the periphery on the outside of the conductive region 15b of the first layer 15 (the region with the width b between the arrows). The outer periphery may be partial, but preferably goes all the way around.

As shown in FIG. 3, for example, the first layer is preferably such that the outer edge of the first layer 15 coincides with the first conduction type semiconductor layer, such as the outer edge of a p-type semiconductor layer 9, and it is particularly favorable for the outer edge of the insulated region 15a to coincide with the outer edge of the first conduction type semiconductor layer. This allows the first conduction type semiconductor layer surface to be reliably covered, thus avoiding damage to the surface.

Figure 7:
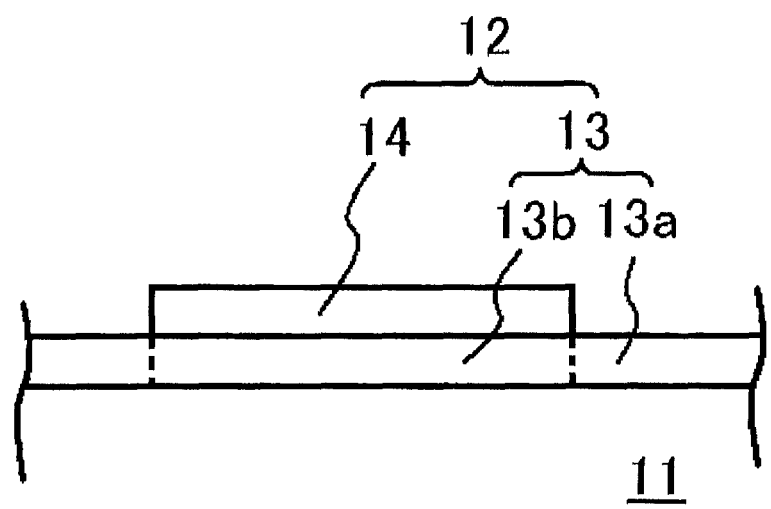
FIG. 7 is a detail enlargement of the main components of an embodiment of still another nitride semiconductor light emitting element of the present invention.

As shown in FIG. 7, for example, all of the first layer 13 may be in contact with the first conduction type semiconductor layer 11, or as shown in FIG. 3 and elsewhere, part of the first layer 15 may be in contact with the first conduction type semiconductor layer 11.

If part of the first layer is in contact with the first conduction type semiconductor layer, that part is formed on a first nitride semiconductor layer via a different layer. This different layer may be an insulating layer, but is preferably a conductive layer. For example, a second layer (discussed below) or the like is preferable. In this case, as shown in FIG. 3, for example, it is preferable if the first layer 15 completely covers the second layer 16, the conductive region 15b is disposed around the outer periphery of the second layer 16 on the first conduction type semiconductor layer (such as the p-type semiconductor layer 9), and the insulated region 15a is disposed around the outer periphery of the conductive region 15b.

The first layer can be formed as a layer that includes titanium, niobium, tantalum, hafnium, aluminum, chrome, vanadium, tungsten, molybdenum, zirconium or zinc as a constituent element. Thus, the conductive region is formed of titanium, niobium, tantalum, hafnium, aluminum, chrome, vanadium, tungsten, molybdenum, zirconium or zinc, and the insulated region is preferably formed of an oxide, and more preferably an oxide of titanium, niobium, tantalum, hafnium, aluminum, chrome, vanadium, tungsten, molybdenum, zirconium or zinc.

There are no particular restrictions on the thickness of the first layer, but it is about 0.1 to 30 nm, for example, with about 1 to 5 nm being preferable.

Electrode with Laminated Structure/Second Layer

As shown in FIGS. 3, 4, 5, 6, and elsewhere, for example, it is good for the electrodes with a laminated structure to have the second layer 16 that is in contact with the first layer 15 (and particularly the conductive region of the first layer). For instance, the second layer can be an electrode formed on the nitride semiconductor layer as what is known as an ohmic electrode. The term "ohmic connection" here is used in the meaning in which it is normally used in this field, and refers, for example, to a junction at which the current/voltage characteristics are either linear or substantially linear. It also means that the voltage drop and power loss at the junction during device operation are small enough to be ignored.

The second layer is preferably such that at least its entire surface is in contact with the nitride semiconductor layer, and more preferably is covered partially or entirely by the first layer. If it is entirely covered, it is more preferable for the entire upper face and side faces of the second layer to be covered by the first layer.

The second layer may be formed form an electroconductive material, and may consist of one or more layers of film. The second layer is preferably a layer that contains silver, and may be a single layer containing silver or a silver alloy, or a multilayer film having a layer that contains silver or a silver alloy. If it is a multilayer film, the lowermost layer is preferably one that contains silver or a silver alloy, and the films other than the lowermost layer may be silver or a silver alloy, or may be layers that do not contain silver or a silver alloy. Furthermore, a layer that contains silver or a silver alloy may include a nickel film partially disposed next to the nitride semiconductor layer.

Examples of the silver alloys include an alloy silver with one or more kinds of metal selected from the group consisting of Pt, Co, Au, Pd, Ti, Mn, V, Cr, Zr, Rh, Cu, Al, Mg, Bi, Sn, Ir, Ga, Nd and Re. Nickel does not readily alloy with silver, that is, its reaction with silver tends to be suppressed, but a silver film may contain elemental nickel.

Examples of the second layer include a single-layer film of silver, and a two-layer structure of a metal (top) that substantially does not react with silver (in other words, a metal whose reaction with silver is suppressed) and silver or a silver alloy (bottom); a two-layer structure of a noble metal (top) and silver or a silver alloy (bottom); a three-layer structure of a noble metal (top), metal (middle) that substantially does not react with silver and silver or a silver alloy (bottom); a four-layer structure of a two-layer of noble metal (top), metal (middle) that substantially does not react with silver, and silver or a silver alloy (bottom); and a four-layer structure of a noble metal (top), two-layer of metal (middle) that substantially do not react with silver and silver or a silver alloy (bottom).

In particular, if the second layer is formed by a multilayer film of at least a layer composed of silver or a silver alloy and a metal film that suppresses a reaction with silver and that is disposed over the silver layer, such as when nickel is disposed in contact with silver or a silver alloy and a noble metal is formed over this, then the movement of silver at the face opposite the face touching the nitride semiconductor can be dramatically prevented in the layer composed of silver or a silver alloy, and migration can be further prevented. In addition, this prevents a decrease in the reflection efficiency of the electrode with respect to light produced by the light emitting layer, and allows a nitride semiconductor element with higher emission efficiency to be obtained. Furthermore, if a layer of titanium, tantalum, or the like is formed between the nickel and the noble metal, this will prevent movement of the silver contacting with the nitride semiconductor layer at the nitride semiconductor layer surface, and will also prevent migration, further enhancing reliability.

Examples of the noble metal here include platinum series metals, gold, and so forth, of which platinum and gold are preferable.

Examples of metals that substantially do not react with silver, that is, metals with which a reaction with silver is suppressed, include metals that substantially do not react with silver at temperatures under 1000° C., or with which the reaction with silver is suppressed. Examples thereof include Nickel (Ni), ruthenium (Ru), osmium (Os), iridium (Ir), titanium (Ti), vanadium (V), niobium (Nb), tantalum (Ta), cobalt (Co), iron (Fe), chromic (Cr), tungsten (W), and the like. Of these, Nickel is preferable.

The phrase "a metal that substantially does not react with silver or with which a reaction with silver is suppressed" refers more specifically to a metal that will not mix with silver to form a solid solution, or will do so only with difficulty, and shall encompass those metals with which the proportion of mixing in silver is less than 5 wt %.

There are no particular restrictions on the thickness of the second layer, but an example in the case of a single layer of silver or a silver alloy is a thickness at which light from the light emitting layer can be effectively reflected, and more specifically, about 20 nm to 1 μm, and preferably about 50 to 300 nm. In the case of a multilayer film, the total thickness is about 50 nm to 5 μm, for example, and preferably about 50 nm to 1 μm. The silver or a silver alloy film contained therein can be suitably adjusted within the above ranges. Also, in the case of a multilayer film, the silver or a silver alloy film and the films that are laminated over this may be given the same shape by patterning in the same step, or the silver or a silver alloy film that is the lowermost layer may be covered by the film laminated over that layer (preferably, a metal film that does not react with silver). Consequently, no matter what electrode material is formed as part of the second layer over the metal film that does not react with silver, since there is no direct contact with the silver or a silver alloy film, a reaction with the silver can be prevented.

In particular, if the second layer includes a silver or a silver alloy layer, and a layer that substantially does not react with silver (a metal with which a reaction with silver is suppressed, such as nickel) is disposed in contact with this silver layer, there will be no reduction in the proportion of silver near the interface with the nitride semiconductor. That is, the silver in the second layer can be prevented from diffusing, moving, etc., out of the second layer and becoming alloyed, the light emitted from the light emitting layer can be reflected very efficiently near the surface of the nitride semiconductor, and the emission efficiency can be enhanced.

Electrode with Laminated Structure/Third Layer

The electrode with the laminated structure preferably has a third layer for connecting with an external electrode, over the first layer and/or the second layer. The term "over" here means that the third layer is electrically connected with the first layer and/or the second layer, but not necessarily in direct contact. What is known as a pad electrode can be used as the third layer for connecting to an external electrode.

Figure 2:
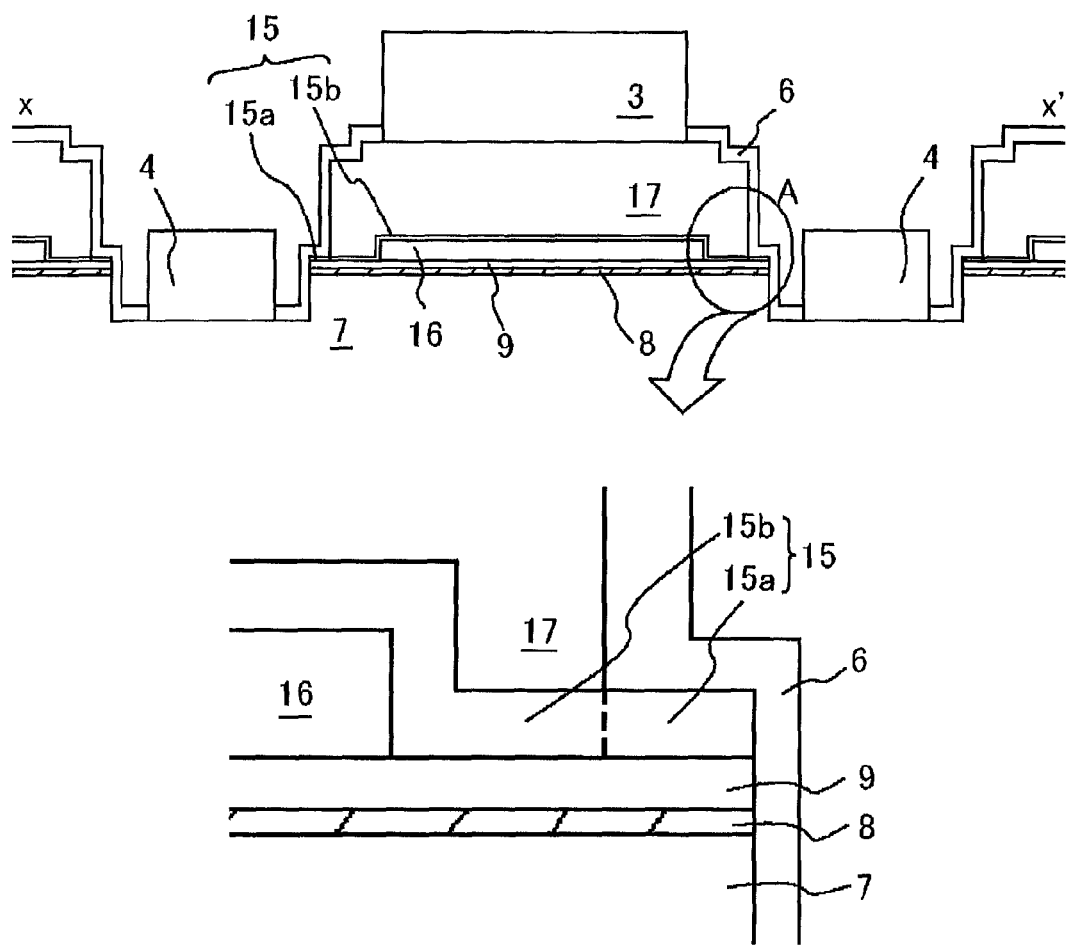
FIG. 2 is a simplified cross section along the x-x' line in FIG. 1, and a detail enlargement of the main components.

The third layer may be formed over the second layer in FIG. 7 according to the shape, layout, and so on of the first and second layers. As shown in FIG. 2, the third layer 3 may be formed over the first layer 15 via a fourth layer 17 (discussed below). The third layer may be disposed so as to be in contact with the entire surface of the first layer or the second layer, or may be disposed so as to be in contact with part of the surface. It is generally preferably if the third layer is disposed in a size that ensures a region large enough for ordinary wire bonding or the like. The "region large enough for wire bonding or the like" here can be suitably adjusted according to the thickness and material of the wire to be used for wire bonding or the like, the material of the third layer, and so forth, but a surface area of about 1000 to 20,000 µm² is suitable, for example. From another standpoint, a size of about 30×30 µm to 200× 200 µm will be suitable.

There are no particular restrictions on the third layer as long as it is made of a conductive material, but a laminated film composed of Ni, Ti, Au, Pt, Pd, W, Co, Au, Mn, V, Cr, Zr, Rh, Cu, Al, Mg, Bi, Sn, Ir, Ga, Nd, Re or another such metal or alloy is preferable. More specifically, examples include a film formed as AlCuSi—Ti—Pu—Al, W—Pd—Au, Ni—Ti—Au, Ni—Pd—Au in that order from the first layer or second layer side.

There are no particular restrictions on the thickness of the third layer, but it is about 100 nm to 1 µm, for example, with about 200 nm to 500 nm being preferable.

Electrode with Laminated Structure/Fourth Layer

The electrode with a laminated structure preferably has a fourth layer between the first layer and the third layer. The fourth layer is preferably in contact with both the first layer (and particularly just the conductive region of the first layer) and the third layer. For instance, as shown in FIG. 2, the fourth layer 17 may be formed in contact over the first layer 15. The outer edge of the fourth layer 17 preferably coincides with the outer edge of the conductive region 15b of the first layer 15. Using a shape such as this makes it easier to produce separate conductive regions in the first layer in the manufacturing method discussed below.

The fourth layer can be formed, for example, by a single layer or a multilayer film of the metal or alloy that forms the above-mentioned second layer or third layer, and it is particularly favorable to have a layer composed of a noble metal. When this is formed by a multilayer film, all of the films preferably have the same shape. Examples of the fourth layer include a one-layer structure of a metal (top) that substantially does not react with silver (in other words, a metal with which a reaction with silver is suppressed), a one-layer structure of a noble metal (top), a two-layer structure of a noble metal (top) and a metal (bottom) that substantially does not react with silver, a three-layer structure of two layers of noble metal (top) and a metal (bottom) that substantially does not react with silver, and a structure of three or more layers of a noble metal (top) and two or more layers of a metal (bottom) that substantially does not react with silver. More specifically, examples include Au (semiconductor layer side)—W, Au (semiconductor layer side)—W—Ti, Au—Ni, and so forth. It is particularly favorable for the fourth layer to be a layer in which gold is disposed on the side closest to the semiconductor layer. This fourth layer can function as an anti-migration film for silver when the second layer is formed from a material containing silver.

There are no particular restrictions on the thickness of the fourth layer, but it is about 0.1 µm to 10 µm, for example, with about 0.1 µm to 5 µm being preferable.

Laminate

The laminate in the light emitting element of the present invention is usually constituted by laminating a first conduction type semiconductor layer, a light emitting layer, and a second conduction type semiconductor layer on a substrate, either in that order or in the reverse order. It is especially favorable if the laminate consists of the second conduction type semiconductor layer, the light emitting layer, and the first conduction type semiconductor layer laminated in that order on a substrate. In this case, the first conduction type semiconductor layer is preferably a p-type semiconductor layer, and the second conduction type semiconductor layer an n-type semiconductor layer.

With this configuration, good ohmic contact is ensured in the n-type nitride semiconductor layer, in which the diffusion of electrons occurs less readily, and current diffusion can be better enhanced, while maximizing the efficiency with which light from the light emitting layer is reflected. Therefore, the light extraction efficiency can be improved, and a light emitting element of higher quality and higher performance can be obtained.

There are no particular restrictions on the material of the laminate, but a gallium nitride compound semiconductor such as $In_XAl_YGa_{1-X-Y}N$ ($0 \leq X$, $0 \leq Y$, $X+Y \leq 1$) can be used to advantage, for example. The laminate may also be a laminated structure such as a homo structure, hetero structure, or double hetero structure having an MIS junction, a PIN junction, or a PN junction.

The semiconductor layers that make up the laminate may each be a single layer, multiple layers, or a superlattice structure, and in particular the light emitting layer can be a single quantum well structure or multiple quantum well structure with laminated thin films that produce a quantum effect.

Each of the semiconductor layers may be doped with either n-type or p-type impurities. These impurities may be added during the formation of the semiconductor layers, or may be doped after the formation of the semiconductor layers.

Each semiconductor layer can be formed by any method that is known in this field such as organic metal vapor phase epitaxy method (MOCVD), Hydride vapor phase epitaxy method (HVPE), molecular ray epitaxial growth method (MBE), sputtering, the ion plating method, the electronic shower method and the like.

There are no particular restrictions on the film thickness of each semiconductor layer, and it can be applied various kinds of film thicknesses.

Figure 1:
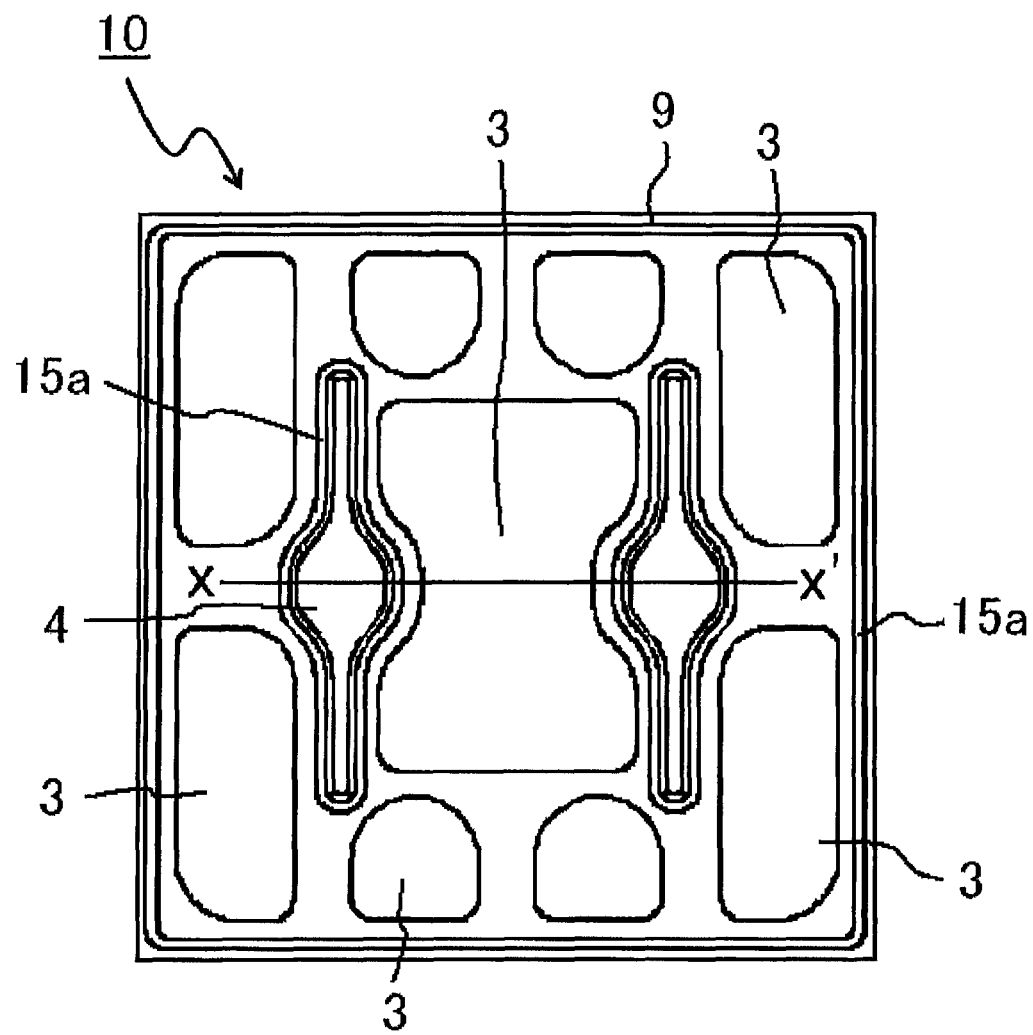
FIG. 1 is a simplified plan view of an embodiment of the nitride semiconductor light emitting element of the present invention.

The light emitting element of the present invention, as shown in FIG. 1, for example, is usually square or substantially square in plan view. Although it will vary with the order in which the semiconductor layers are laminated, the second conduction type semiconductor layer, for example, has an exposed region in a partial region of one light emitting element, in which the first conduction type semiconductor layer, the light emitting layer, and, if desired, part of the second conduction type semiconductor layer in the depth direction, are removed so that the surfaces are exposed. There are no particular restrictions on the size, shape, or layout of this exposed region, which can be adjusted as desired.

An electrode is formed over the exposed region of the second conduction type semiconductor layer. This electrode may be an electrode with a laminated structure including a first layer formed over the first conduction type semiconductor layer as discussed above, and may be an electrode composed a single layer or a multilayer film.

Substrate

Examples of the substrate include a well-known insulating substrate such as sapphire, spinel, SiC, GaN, the GaAs and a conductive substrate such as GaN, SiC. Of these, a sapphire substrate is preferable.

The insulating substrate may ultimately be removed, but need not be. If the insulating substrate is removed, a pair of electrodes, namely a p electrode and an n electrode, may be formed on the same side, or may be formed on different sides. If the insulating substrate is not removed, then usually the p electrode and the n electrode are both formed on the same side of the substrate.

The substrate may be one with a flat surface, or texturing or the like may be formed regularly or irregularly to the extent that light generated from the light emitting layer can be scattered.

Light Emitting Device Produced with Nitride Semiconductor Light Emitting Element The light emitting element of the present invention is mounted on a supporting substrate by flip-chip mounting (face-down mounting) to constitute a semiconductor light emitting device.

Wiring is provided to at least the side of the supporting substrate that is opposite the electrodes of the light emitting element, a protective element or the like may be formed as needed, and the flip-chip mounted light emitting element is fixed and supported. The supporting substrate is made from a material having substantially the same coefficient of thermal expansion as that of the light emitting element, and aluminum nitride is preferable for a nitride semiconductor element, for example. This lessens the effect of thermal stress generated between the supporting substrate and the light emitting element. Also, silicon may be used, which is inexpensive and adds the function of an electrostatic protective element or the like. There are no particular restrictions on the wiring pattern, but it is preferable, for example, if the positive and negative wiring patterns are formed so that they are insulated and separated, with one surrounding the other.

When the light emitting element is mounted on the supporting substrate, for example, a bump composed of gold or the like is placed on the supporting substrate, or an electrode that can be connected to a third layer (that is, an external electrode) in the above-mentioned light emitting element is placed opposite the electrode or bump formed on the supporting substrate, and an electrical and mechanical connection is made. The connection can be made, for example, by ultrasonic joining and/or heat treatment using gold, a eutectic material (Au—Sn, Ag—Sn), solder (Pb—Sn), lead-free solder, or another such joining member. When the wiring and a lead electrode are directly connected, they can be connected with gold paste, silver, paste, or another such joining member, for example.

Method for Manufacturing Nitride Semiconductor Light Emitting Element

The method for manufacturing a nitride semiconductor light emitting element of the present invention includes the following steps. (a) forming a laminate in which a first conduction type semiconductor layer, a light emitting layer, and a second conduction type semiconductor layer of a different conduction type from that of the first conduction type semiconductor layer are laminated, (b) forming a first metal layer (corresponds to the first layer) that is in contact with at least part of the upper face of the first conduction type semiconductor layer, (c) laminating a second metal layer (corresponds to the fourth layer) over said first metal layer, and (d) patterning said second metal layer so that part of the first metal layer is exposed, and oxidizing the exposed first metal layer, thereby forming an insulated region on the first metal layer disposed on the outer periphery of the second metal layer. This allows the insulated region and a conductive region to be disposed on the first metal layer. It is preferable for the insulated region and the conductive region both to be in contact with the first conduction type semiconductor layer, but just the insulated region may be in contact with the first conduction type semiconductor layer.

In the following description of the manufacturing method, p-type and n-type components are specified, but the p-type and n-type may be switched around.

In step (a), the first conduction type semiconductor layer, the light emitting layer, and the second conduction type semiconductor layer are formed on a substrate in that order or in the reverse order. Each semiconductor layer can be formed by a method that is known in this field. Impurities may be introduced during film formation, or may be introduced after a film has been formed.

For instance, when an n-type semiconductor layer, a light emitting layer, and a p-type semiconductor layer are laminated in that order, usually the light emitting layer and p-type semiconductor layer laminated over the n-type semiconductor layer are removed from a partial region thereof, and part of the n-type semiconductor layer itself may also be removed in the thickness direction if desired, thereby exposing part of the n-type semiconductor layer. The removal of the semiconductor layers here can be accomplished using a known method, such as using a photoresist and etching.

To subject the laminate to the steps from (b) on, a step in which part of the above-mentioned n-type semiconductor layer (or p-type semiconductor layer) is exposed after the various semiconductor layers have been laminated can be performed at any stage after each of the steps, and not just after step (a) and before step (b).

In step (b), a first metal layer is formed that is in contact with at least part of the upper face of the first conduction type semiconductor layer.

The first metal layer here may be a single layer or a multilayer film. Examples of the material of the first metal layer include the same as those listed for the first layer above.

If the first metal layer is formed on the upper face of the p-type semiconductor layer, which is disposed above the light emitting layer (on the opposite side from the substrate), the first metal layer may be formed in contact with at least part of the upper face of the p-type semiconductor layer. In this case, the first metal layer (i) may be in contact with just the upper face of the p-type semiconductor layer (see the first layer 15 in FIG. 2), (ii) may be in contact with the side face of the p-type semiconductor layer, the side face of the light emitting layer, and/or the side face and top face, etc., of the n-type semiconductor layer (see the first layer 15 in FIG. 6), or (iii) the entire first metal layer may be in contact with the first conduction type semiconductor layer (see the first layer 13 in FIG. 7).

Figure 6:
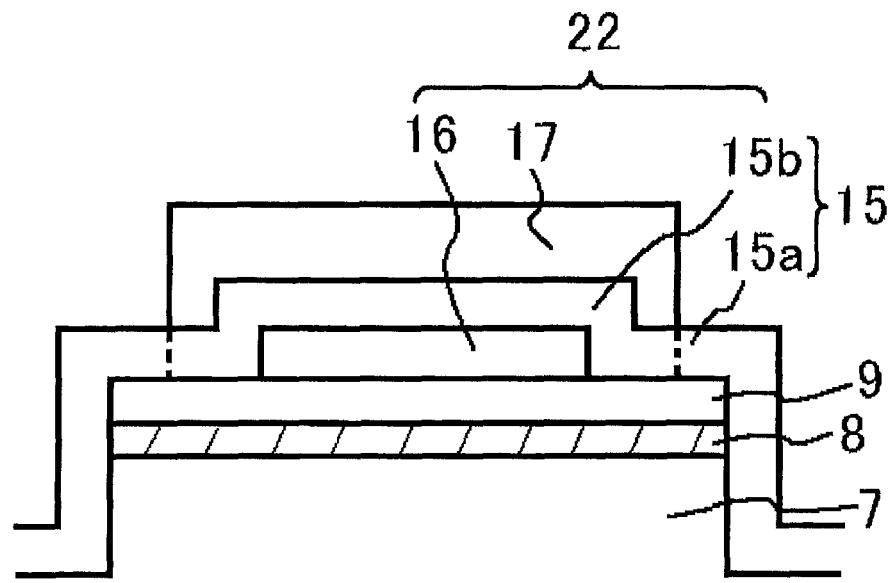
FIG. 6 is a simplified plan view of an embodiment of another nitride semiconductor light emitting element of the present invention.

In the case of (i) and (ii) above, for example, it is good for a third metal layer to be formed over the p-type semiconductor layer prior to step (b) (see the second layer 16 in FIGS. 2 and 6, etc.). This third metal layer may be a single layer or a multilayer film. Examples of the material of the third metal layer include the same as those listed for the second layer and/or third layer above. The third metal layer in plan view is preferably formed so that it does not overlap the pn junction of the semiconductor layer, such as when its outer edge is disposed to the inside of the outer edge of the p-type semiconductor layer.

Figure 8A:
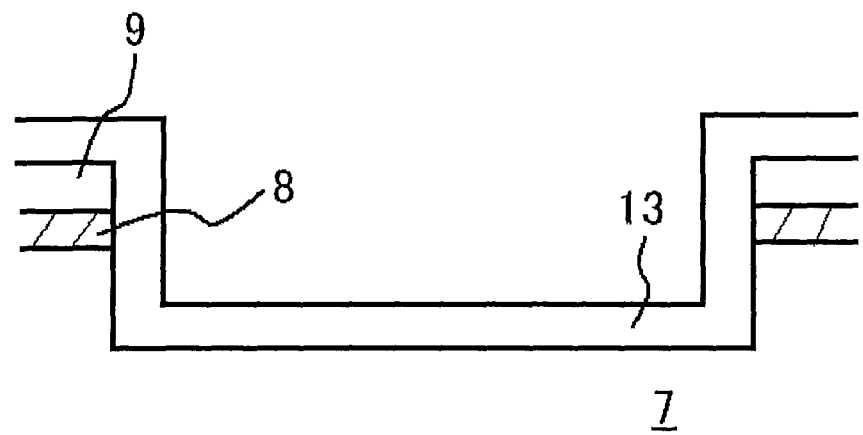
FIG. 8A is a simplified process drawing illustrating the electrode structure in the light emitting element in FIG. 7.

If the first metal layer is formed on the upper face of the partially exposed n-type semiconductor layer disposed under (on the substrate side of) the light emitting layer, it preferably covers the entire surface of the upper and side faces of the partially exposed n-type semiconductor layer, and the first metal layer may also cover the surfaces of the light emitting layer 8 and the p-type semiconductor layer 9 (see the first layer 13 in FIG. 8A).

Thus, since a layer that can become an electrode is covering the upper face of the first conduction type semiconductor layer substantially without any exposure, that surface will not be subjected to any subsequent steps that would roughen it, and in particular the etching or the like of the surrounding region of the upper face of the first conduction type semiconductor layer, so damage to the crystals is suppressed on the upper face of the first conduction type semiconductor layer. Consequently, there is less deterioration of the characteristics of the light emitting element and less variance in the characteristics from one light emitting element to the next when they are formed from a single wafer, which makes it possible to obtain a good quality light emitting element with uniform characteristics.

In step (c), the second metal layer is laminated over the first metal layer. The second metal layer may be a single layer or a multilayer film. Examples of the material of the second metal layer include the same as those listed for the fourth layer above.

In step (d), the second metal layer is patterned and part of the first metal layer is oxidized. This forms a conductive region and an insulated region in the first metal layer.

As shown in FIG. 8, for example, the patterning of the second metal layer here may be performed so as to expose part of the first metal layer (the first layer 13) from the second metal layer (the fourth layer 14). Also, the patterning of the second metal layer may be performed so that the outer edge of the second metal layer (the fourth layer 17) is to the inside of the outer edge of the p-type semiconductor layer 9 and to the outside of the outer edge of the third metal layer (the second layer 16). Furthermore, as shown in FIG. 5B, it may be performed so that the outer edge of the second metal layer (the fourth layer 17) is disposed to the inside of the outer edge of the third metal layer (the second layer 16) and the p-type semiconductor layer 9.

Methods known in this field can be used for the patterning and oxidation. The oxidation may be performed during or after the patterning. In particular, the oxidation can be accomplished by a method in which patterning is performed using an etchant that can oxidize the first metal layer, or patterning is performed under an oxidative atmosphere, or a surface treatment is performed such as heating under an oxidative atmosphere during or after patterning, or surface treatment is performed with an oxidative gas or solution.

The nitride semiconductor light emitting element, and the method for its manufacture, of the present invention will now be described in detail through reference to the drawings.

Example 1

Light Emitting Element

The light emitting element of this working example is shown in FIGS. 1 and 2.

This light emitting element 10 has a laminate made up of nitride semiconductor layers formed over a sapphire substrate (not shown). The laminate has a buffer layer (not shown) composed of $Al_{0.1}Ga_{0.9}N$ and a non-doped GaN layer (not shown), over which are laminated an n-type contact layer composed of silicon-doped GaN (as an n-type semiconductor layer 7), a superlattice n-type clad layer obtained by alternately laminating a GaN layer (40 Å) and an InGaN layer (20 Å) ten times, on this a light emitting layer 8 with a multiple quantum well structure obtained by alternately laminating a GaN layer (250 Å) and an InGaN layer (30 Å) three to six times, over this a superlattice p-type clad layer obtained by alternately laminating a magnesium-doped $Al_{0.1}Ga_{0.9}N$ layer (40 Å) and a magnesium-doped InGaN layer (20 Å) ten times (as a p-type semiconductor layer 9), and a p-type contact layer composed of magnesium-doped GaN.

In a partial region of the n-type semiconductor layer 7, the light emitting layer 8 and the p-type semiconductor layer 9 laminated thereover are removed, part of the n-type semiconductor layer 7 itself in the thickness direction is removed and exposed, and an n electrode 4 is formed on this exposed n-type semiconductor layer 7. The planar shape of the exposed n-type semiconductor layer 7 is, as shown in FIG. 1, for example, that of a disk that bulges in the center, and this layer is formed at two places near the near of a single light emitting element.

An electrode with a laminated structure is formed over the p-type semiconductor layer 9.

The electrode with the laminated structure is made up of the conductive region of the first layer 15, the second layer 16, the fourth layer 17, and the third layer 3.

The second layer 16 is composed of a multilayer film in contact with the p-type semiconductor layer 9, and is produced by laminating a silver film with a thickness of 100 nm, a nickel film with a thickness of 100 nm, a titanium film with a thickness of 100 nm, and a platinum film with a thickness of 100 in that order. The outer edge of the second layer 16 is disposed to the inside of the semiconductor layer 11 of the laminate, that is, the p-type semiconductor layer 9. As shown in FIG. 3, for example, the outer edge of the second layer 16 is about 14 µm (arrows a+b) away from the outer edge of the p-type semiconductor layer 9.

The first layer 15 is in contact with the upper face of the p-type semiconductor layer 9 so as to substantially completely cover the upper and side faces of the second layer 16 and cover substantially the entire surface of the p-type semiconductor layer 9. As shown in the detail enlargement in FIG. 2 and in FIG. 3, the first layer 15 has a conductive region 15b and an insulated region 15a in its region of contact with the p-type semiconductor layer 9. The conductive region 15b is the outer peripheral region of the second layer 16 (the region indicated by the arrow a in FIG. 3), in addition to the region in contact with the second layer 16. The width (arrow a in FIG. 3) of the conductive region in contact with the p-type semiconductor layer 9 is about 9 µm, for example. The outer edge of the conductive region 15b substantially coincides with the outer edge of the p-type semiconductor layer. The width (arrow b in FIG. 3) of the conductive region 15b is about 5 µm, for example. The first layer 15 is formed by a titanium-containing film with a thickness of 2 nm. Therefore, the conductive region 15b is composed of titanium, and the insulated region 15a is composed of titanium oxide.

The fourth layer 17 is formed on the conductive region 15b of the first layer 15. The fourth layer 17 is composed of a multilayer film, and is produced by laminating a gold film with a thickness of 2.0 µm, a tungsten film with a thickness of 100 nm, and a titanium film with a thickness of 10 nm in that order.

The third layer 3 is an electrode used for external connection, and is what is called a pad electrode. The third layer 3 is composed of a multilayer film, and is produced by laminating an Al—Cu—Si film with a thickness of 500 nm, a titanium film with a thickness of 100 nm, a platinum film with a thickness of 100 nm, and a gold film with a thickness of 1.0 µm in that order. The third layer 3 is in contact with the fourth layer 17 on a surface area large enough to supply adequate power from the outside.

The n electrode 4 is formed, for example, from Al, Ti, Ni, Cr, Mo, Nb, Co, V, Au, Pt, Pd, W, Mn, Zr, Rh, Cu, Mg, Bi, Sn, Ir, Ga, Nd, Re, Al—Cu—Si (an aluminum alloy containing 2 wt % copper and 1 wt % silicon) or the like.

The region of this light emitting element that is not covered by the n electrode 4 and the fourth layer 17 is protected by a protective film 6 composed of silicon oxide and having a thickness of about 500 nm.

Power was sent to the light emitting element configured as above in an atmosphere with a temperature of 85° C. and a humidity of 85%, and at If=700 mA, and after continuous operation for 7000 hours under these conditions, a cross section was observed by SEM, which revealed no migration of the silver, nor any leakage current.

For the sake of comparison, a light emitting element was formed with no insulated region, and its characteristics were compared with those of the light emitting element of the present invention obtained above. With the light emitting element in this Example, under operating conditions of atmosphere with a temperature of 85° C., a humidity of 85%, and If=700 mA, with an average value of n (the number of light emitting elements evaluated)=6, the light output was confirmed to be increased by approximately 5% versus the light emitting element in which no insulated region was formed.

Also, variance in Vf voltage between elements was cut in half as compared to the above-mentioned light emitting element in which no insulated region was formed, and it was confirmed that a light emitting element with stable characteristics was obtained.

With the light emitting element of this working example, since the surface of the p-type semiconductor layer was covered by an electrode containing silver, light generated from the light emitting layer could be reflected efficiently. Also, since the electrode containing silver was covered by the first layer and the fourth layer, the silver on the p-type semiconductor layer surface was effectively prevented from migrating. Furthermore, since the insulated region in the first layer covered substantially the entire surface of the p-type semiconductor layer, the leakage of light from this portion could be reliably prevented, and more efficient emission could be achieved.

Example 2

Method for Manufacturing Light Emitting Element

The light emitting element shown in FIGS. 1 and 2 was formed as follows.

Formation of Semiconductor Layer

A wafer was produced by using a MOVPE reaction apparatus to grow a buffer layer (10 nm) composed of $Al_{0.1}Ga_{0.9}N$, a non-doped GaN layer (1.5 µm), an n-type contact layer composed of silicon-doped GaN (2.165 µm; as the third layer 3), a superlattice n-type clad layer (64 nm) obtained by alternately laminating a GaN layer (4 nm) and an InGaN layer (2 nm) ten times, a light emitting layer 4 with a multiple quantum well structure obtained by alternately laminating a GaN layer (25 nm) and an InGaN layer (3 nm) three to six times, a superlattice p-type clad layer (0.2 µm) obtained by alternately laminating a magnesium-doped $Al_{0.1}Ga_{0.9}N$ layer (4 nm) and a magnesium-doped InGaN layer (2 nm) ten times (as a p type semiconductor layer 5), and a p-type contact layer (0.5 µm) composed of magnesium-doped GaN, on a sapphire substrate with a diameter of 2 inches.

Electrode Formation

A resist pattern having an opening in the desired region was formed on the p-type semiconductor layer 9, the wafer was put in a sputtering apparatus, and a silver film was formed in a thickness of 100 nm in this sputtering apparatus using a silver target and argon for the sputtering gas. By the same method, a nickel film with a thickness of 100 nm, a titanium film with a thickness of 100 nm, and a platinum film with a thickness of 100 nm were laminated in that order. After this, these films were patterned in a specific shape by lift-off (see the second layer 16 in FIG. 4A, for example).

Next, a titanium film was formed in a thickness of 10 nm (see the first layer 15 in FIG. 4A, for example) on substantially the entire surface of the p-type contact layer of the wafer and over the laminated film corresponding to the above-mentioned second layer 16, using a titanium target and argon for the sputtering gas in a sputtering apparatus.

Further, by the same method, a gold film with a thickness of 2.0 µm a tungsten film with a thickness of 100 nm, and a titanium film with a thickness of 10 nm were laminated in that order, and finally a $SiO_2$ film with a thickness of 600 nm was formed.

A resist pattern in the desired shape was formed on the $SiO_2$ film, and this resist pattern was used as a mask to perform wet etching using hydrofluoric acid as the etchant, thereby patterning the $SiO_2$ film and the titanium film both at once in a specific shape.

Then, the tungsten film was patterned by wet etching using a mixture of nitric acid and acetic acid as the etchant, and wet etching was performed using iodine-potassium iodide (does not dissolve titanium) as the etchant to pattern the gold film in the same shape, leaving just the titanium film (the bottom layer) exposed and unetched. When the etching was finished, an acidic solution was used to rinse the electrode surface and remove the resist. The remaining titanium film was thin (with a thickness of about 10 nm), so it was oxidized by the application of heat in the rinsing and subsequent steps following resist removal.

Figure 4A:
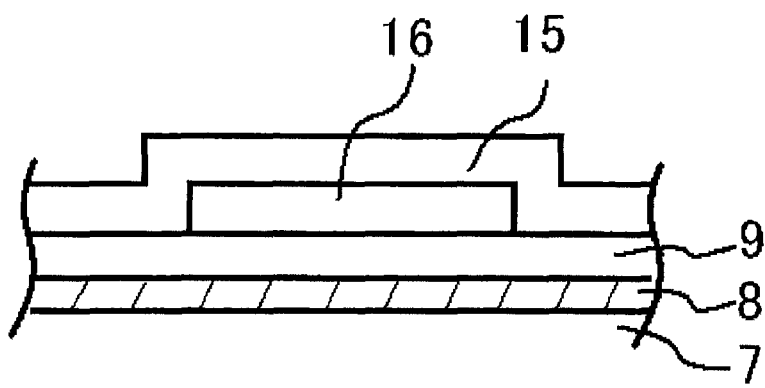
FIG. 4A is a simplified process drawing illustrating the electrode structure in the light emitting element in FIG. 1.
Figure 4B:
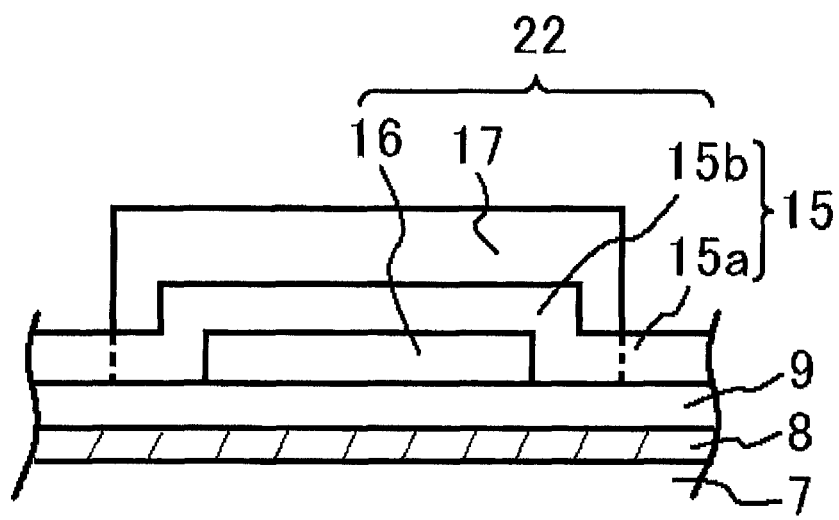
FIG. 4B is a simplified process drawing illustrating the electrode structure in the light emitting element in FIG. 1.

Consequently, the titanium film exposed from the gold and other films could be converted into titanium oxide, and as shown in FIG. 4B, for example, a layer comprising the conductive region 15b and the insulated region 15a was formed as part of an electrode with a laminated structure 22 in the first layer 15, in the region in contact with the semiconductor layer.

Etching

The obtained wafer was annealed in a reaction vessel at 600° C. and in a nitrogen atmosphere, thereby further lowering the resistance of the p-type clad layer and the p-type contact layer.

After annealing, the wafer was taken out of the reaction vessel, a mask was formed in a specific shape on the surface of the p-type contact layer, which was the uppermost layer on which part of the above-mentioned electrode with a laminated structure 22 was formed, and the semiconductor layers and the insulated region of the first layer were etched from above the mask with an etching apparatus to expose part of the n-type contact layer. Since the area near the pn junction interface here is covered by the first layer, damage can be prevented during etching. Also, since the first layer disposed here is in the form of an oxide layer, there will be no subsequent short-circuiting even if there is contact with the pn junction.

The mask was then removed.

Formation of Protective Film

An $SiO_2$ film was formed in a thickness of 600 nm as the protective film 6 over the resulting wafer, and an $SiO_2$ film having an opening in the desired region was formed using a photoresist and etching.

Formation of Pad Electrode

Next, a heat treatment was carried out with an annealing apparatus at a temperature that would not affect the element characteristics of the p-type contact layer and other semiconductor layers, and that was under the temperature at which silver and gold will not mix.

A mask having a specific pattern was formed with a resist over the protective film 6, the n electrode 4, and the electrode with a laminated structure on the p side, over this an Al—Cu—Si film with a thickness of 500 nm, a titanium film with a thickness of 100 nm, and a platinum film with a thickness of 100 nm were laminated in that order, and the n electrode 4 and a bonding-use pad electrode (the third layer 3 (p pad electrode) in FIG. 2) were formed by lift-off method.

The wafer thus obtained was divided at specific locations to obtain light emitting elements.

Example 3

Method for Manufacturing Light Emitting Element

As shown in FIG. 5B, for example, the light emitting element of this Example had substantially the same configuration as the light emitting element in Example 1, except that the insulated region 15a of the first layer 15 was also formed on the side faces of the p-type semiconductor layer 9 and the light emitting layer 8 and on the side and upper faces of the n-type semiconductor layer 7, and the outer edge of the fourth layer 17 was disposed to the inside of the outer edge of the second layer 16.

This light emitting element can be formed by the following method.

Figure 5A:
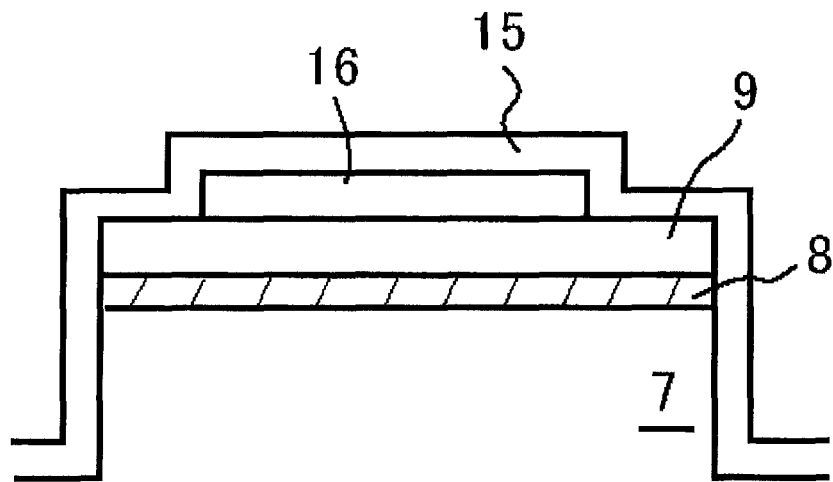
FIG. 5A is a simplified process drawing illustrating the electrode structure in anther light emitting element of the present invention.
Figure 5B:
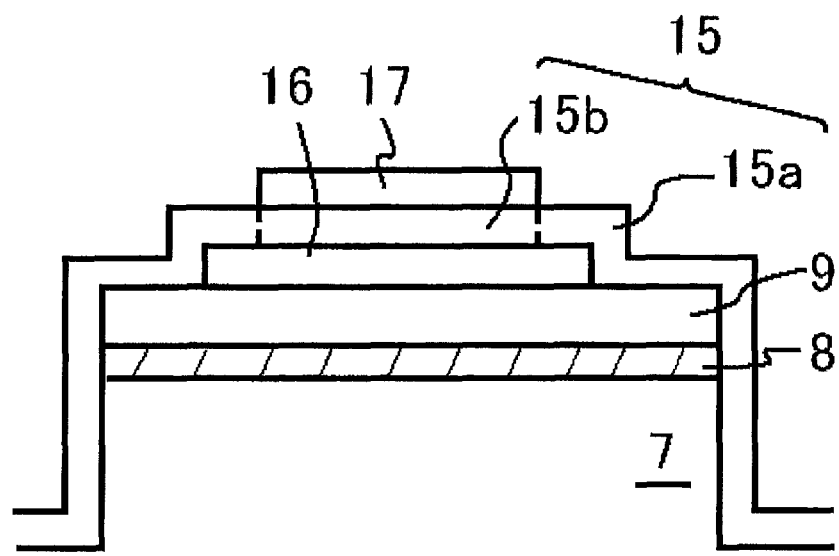
FIG. 5B is a simplified process drawing illustrating the electrode structure in anther light emitting element of the present invention.

A silver film, a nickel film, a titanium film, and a platinum film were laminated over the p-type semiconductor layer 9 and patterned just as in Example 2 (see FIG. 5A).

Next, the semiconductor layers were patterned so as to expose part of the n-type semiconductor layer 7.

After this, a titanium film was formed in a thickness of 100 nm (the first layer 15 in FIG. 5A, for example) on substantially the entire surface of the wafer in substantially the same manner as in Example 2. This titanium film can also be formed on the side faces of the p-type semiconductor layer 9 and the light emitting layer 8, and on the side and upper faces of the n-type semiconductor layer 7.

After this, a gold film, a tungsten film, a titanium film, and an $SiO_2$ film were formed in the same manner as in Example 2.

These films were then patterned in a specific shape in the same manner as in Example 2. Here, the shape of these films is patterned so that the outer edge of the fourth layer 17 is disposed to the inside of the outer edge of the second layer 16, corresponding to the fourth layer 17 in FIG. 5B.

During or immediately after this patterning, the insulated region 15a is formed in the first layer 15 in substantially the same manner as in Example 2, so the insulated region is also formed on the side faces of the p-type semiconductor layer 9 and the light emitting layer 8 and on the side and upper faces of the n-type semiconductor layer 7, from above the fourth layer 17 (see FIG. 5B).

The subsequent steps can be carried out in accordance with Example 2.

Example 4

Light Emitting Element and Method for its Manufacture

As shown in FIG. 6, for example, the light emitting element in this example has substantially the same configuration as the light emitting element in Example 1, except that the insulated region 15a of the first layer 15 was also formed on the side faces of the p-type semiconductor layer 9 and the light emitting layer 8 and on the side and upper faces of the n-type semiconductor layer 7.

Just as in Example 1, highly efficient emission can be obtained with a light emitting element with this configuration.

This light emitting element can be formed in substantially the same manner as in Example 3, except that the gold film, the tungsten film, the titanium film, and the $SiO_2$ film are patterned so that the outer edge of the fourth layer 17 is disposed to the outside of the outer edge of the second layer 16.

Example 5

Light Emitting Element

The light emitting element of this working example is shown in FIG. 7.

This light emitting element 10 has the same semiconductor laminated structure as in Example 1, and a partial region of the n-type semiconductor layer 7 is exposed just as in Example 1.

Part of an electrode with a laminated structure 12 is formed over this exposed n-type semiconductor layer 7.

Part of the electrode with the laminated structure 12 is constituted by the first layer 13 and the fourth layer 14.

The first layer 13 is disposed in contact with the upper face of the n-type semiconductor layer so as to cover substantially the entire surface of the n-type semiconductor layer exposed as the first conduction type semiconductor layer 11. The first layer 13 has a conductive region 13b and an insulated region 13a in the region of contact with the n-type semiconductor layer. The first layer 13 is formed by a titanium-containing film with a thickness of 2 nm. Therefore, the conductive region 13b is composed of titanium, and the insulated region 13a is composed of titanium oxide.

The fourth layer 14 is formed on the conductive region 13b of the first layer 13. The fourth layer 14 is composed of a multilayer film, and is produced by laminating a gold film with a thickness of 1.7 µm, a tungsten film with a thickness of 120 nm, and a titanium film with a thickness of 3 nm in that order.

Figure 8B:
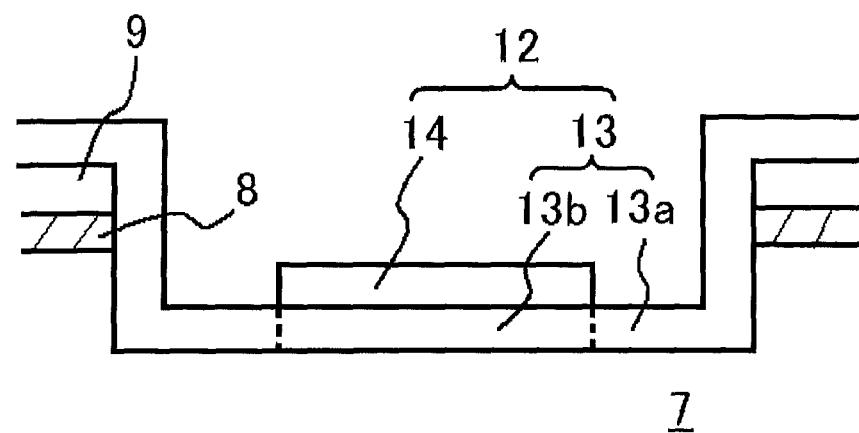
FIG. 8B is a simplified process drawing illustrating the electrode structure in the light emitting element in FIG. 7.

In FIG. 7, only an n-type semiconductor layer is shown as the semiconductor layer 11, but usually, as shown in FIG. 8B, the insulated region 13a of the first layer 13 is also disposed on the upper and side faces of the n-type semiconductor layer 7, the side faces of the light emitting layer 8, and the side and upper faces of the p-type semiconductor layer 9.

Just as in Example 1, highly efficient emission can be obtained with a light emitting element with this configuration.

Example 6

Light Emitting Element

The light emitting element in this example as substantially the same structure as in Example 5, except that an electrode with a laminated structure formed on a p-type semiconductor layer was used instead of an electrode with a laminated structure formed on an exposed n-type semiconductor layer as in Example 5.

Just as in Example 1, highly efficient emission can be obtained with a light emitting element with this configuration.

Example 7

Method for Manufacturing Light Emitting Element

As shown in FIG. 8B, for example, a light emitting element in which part of the electrode with a laminated structure 12 is formed over the exposed n-type semiconductor layer 7 can be formed by the following method.

A laminate of semiconductor layers is formed and part of the n-type semiconductor layer 7 is exposed just as in Example 2.

Then, as shown in FIG. 8A, a titanium film is formed as the first layer 13 over a wafer including the exposed n-type semiconductor layer 7.

A gold film with a thickness of 2.0 µm is formed as the fourth layer 14 on the titanium film, and is patterned in the desired shape.

An insulated region 13a is formed in the titanium film exposed from the fourth layer 14, either during or immediately after this patterning. Thus, the insulated region 13a is also formed on the side faces of the p-type semiconductor layer 9 and the light emitting layer 8 and on the side and upper faces of the n-type semiconductor layer 7, from the top face of the p-type semiconductor layer 9.

The nitride semiconductor element of the present invention can be preferably used in semiconductor light emitting elements constituting various sources of light such as a backlight source of light, a display, illumination, the automotive lamp; semiconductor light receiving elements and other semiconductor devices.

DESCRIPTION OF THE NUMERALS

3: third layer (pad electrode), 4: n electrode, 6: protective film, 7: n-type semiconductor layer, 8: light emitting layer, 9: p-type semiconductor layer. 10: light emitting element, 11: first conduction type semiconductor layer, 13, 15: first layer (first metal layer), 13a, 15a: insulated region, 13b, 15b: conductive region, 16: second layer (the third metal layer), 14, 17: fourth layer (the second metal layer), 12, 22: electrode with a laminated structure

The invention claimed is:

1. A nitride semiconductor light emitting element comprising:
    a laminate of a first conduction type semiconductor layer, a light emitting layer and a second conduction type semiconductor layer of a different conduction type from that of the first conduction type semiconductor layer; and
    electrodes with a laminate structure formed on the first conduction type semiconductor layer,
    the electrodes including a first layer having a single layer structure including a conductive region and an insulated region, and a fourth layer covering the conductive region of the first layer, an outer edge of the fourth layer coinciding with an outer edge of the conductive region of the first layer.

2. The nitride semiconductor light emitting element according to claim 1, wherein
    the electrode with the laminated structure further comprises a second layer being such that at least its entire surface is in contact with the nitride semiconductor layer, and a third layer,
    the first layer covers the second layer, and has the conductive region disposed around the outer periphery of the second layer and the insulated region disposed around the outer periphery of the conductive region, respectively, and
    the third layer is formed on the fourth layer.

3. The nitride semiconductor light emitting element according to claim 1, wherein
    the second layer is an electrode that contains silver, and an entire upper face and side faces of the second layer are covered by the first layer.

4. The nitride semiconductor light emitting element according to claim 1, wherein
    the insulated region is formed of an oxide.

5. The nitride semiconductor light emitting element according to claim 1, wherein the first layer contains titanium, niobium, tantalum, hafnium, aluminum, chrome, vanadium, tungsten, molybdenum, zirconium or zinc as a constituent element.

6. The nitride semiconductor light emitting element according to claim 1, wherein
the first layer is such that an outer edge of the insulated region coincides with an outer edge of the first conduction type semiconductor layer.

7. The nitride semiconductor light emitting element according to claim 1, wherein
the first conduction type semiconductor layer is a p type semiconductor layer, and the second conduction type semiconductor layer is an n type semiconductor layer.

8. A method for manufacturing a nitride semiconductor light emitting element comprising the steps of:
  (a) forming a laminate in which a first conduction type semiconductor layer, a light emitting layer and a second conduction type semiconductor layer of a different conduction type from that of the first conduction type semiconductor layer are laminated;
  (b) forming a first metal layer that is in contact with at least part of an upper face of the first conduction type semiconductor layer;
  (c) laminating a second metal layer on the first metal layer; and
  (d) patterning the second metal layer so that part of the first metal layer is exposed, and oxidizing the exposed first metal layer, thereby forming a conductive region in the first metal layer disposed under the second metal layer and an insulated region in the first metal layer disposed on an outer periphery of the second metal layer, an outer edge of the second metal layer coinciding with an outer edge of the conductive region of the first metal layer.

9. The method for manufacturing a nitride semiconductor light emitting element according to claim 8, wherein
in the step (b), forming the first metal layer such that an upper surface of the semiconductor layer disposed above the light emitting layer is covered.

10. The method for manufacturing a nitride semiconductor light emitting element according to claim 8, further comprising the step of
forming a third layer on the semiconductor layer disposed above the light emitting layer, before the step (b) and then
in the step (b), forming the first metal layer on the first conduction type semiconductor layer.

11. The method for manufacturing a nitride semiconductor light emitting element according to claim 8, wherein
in the step (b), forming the first metal layer such that an entire surface of the first conduction type semiconductor layer is covered.

12. The method for manufacturing a nitride semiconductor light emitting element according to claim 8, wherein
in the step (a), forming the lamination such that an n type semiconductor layer in which part hereof is exposed, the light emitting layer and the p type semiconductor layer are laminated,
in the step (b), forming the first metal layer from on the exposed n type semiconductor layer to the surface of the p type semiconductor layer, and
in the step (d), forming the insulated region in the first metal layer from on the exposed part of the n type semiconductor layer to the surface of the p type semiconductor layer, at patterning the second metal layer so that part of the first metal layer is exposed.

* * * * *